United States Patent
Rouhana et al.

(10) Patent No.: US 11,368,091 B2
(45) Date of Patent: Jun. 21, 2022

(54) METHOD FOR CONTROLLING A BOOST CONVERTER HAVING N SWITCHING CELLS

(71) Applicants: Renault s.a.s., Boulogne-Billancourt (FR); NISSAN MOTOR CO., LTD., Yokohama (JP)

(72) Inventors: Najib Rouhana, Massy (FR); Abdelmalek Maloum, Chevilly Larue (FR)

(73) Assignees: Renault s.a.s., Boulogne-Billancourt (FR); NISSAN MOTOR CO., LTD., Yokohama (JP)

( * ) Notice: Subject to any disclaimer, the term of this patent is extended or adjusted under 35 U.S.C. 154(b) by 0 days.

(21) Appl. No.: 17/278,520

(22) PCT Filed: Sep. 19, 2019

(86) PCT No.: PCT/EP2019/075225
§ 371 (c)(1),
(2) Date: Mar. 22, 2021

(87) PCT Pub. No.: WO2020/069878
PCT Pub. Date: Apr. 9, 2020

(65) Prior Publication Data
US 2022/0038007 A1    Feb. 3, 2022

(30) Foreign Application Priority Data

Sep. 24, 2018 (FR) ..................................... 18 58626

(51) Int. Cl.
*H02M 3/158* (2006.01)
*H02M 1/00* (2006.01)
(Continued)

(52) U.S. Cl.
CPC ....... *H02M 3/1584* (2013.01); *H02M 1/0003* (2021.05); *G01R 19/16538* (2013.01);
(Continued)

(58) Field of Classification Search
CPC ............. H02M 3/1584; H02M 3/1586; H02M 1/0003; H02M 1/0067; H02M 1/0084; G01R 19/16538; H02P 27/06
See application file for complete search history.

(56) References Cited

U.S. PATENT DOCUMENTS

| 8,710,810 B1 * | 4/2014 | McJimsey | ............. | H02M 3/158 |
| | | | | 323/283 |
| 2009/0128101 A1 * | 5/2009 | Skinner | ............... | H02M 3/1584 |
| | | | | 323/220 |

(Continued)

FOREIGN PATENT DOCUMENTS

CN          105656022 B      6/2018

OTHER PUBLICATIONS

International Search Report dated Mar. 9, 2020 in PCT/EP2019/075225 filed on Sep. 19, 2019, citing documents AO & AX-AZ therein, 3 pages (Continued)

*Primary Examiner* — Jue Zhang
(74) *Attorney, Agent, or Firm* — Oblon, McClelland, Maier & Neustadt, L.L.P.

(57) ABSTRACT

A method controls a boost converter having N switching cells using synchronous pulse width modulation, in which N is a natural integer that does not equal zero. The method includes: measuring input voltages and output voltages of the boost converter; determining an output vector to define a representation of a linear state of the boost converter; calculating the variation in power of the electrical load; determining the N duty factors as a function of the second (Continued)

derivative of the output vector, the derivative of the power of the electrical load, and the ratio between the input voltage and the output voltage that have been measured; and controlling each switching cell of the converter depending on the duty factor that has been determined.

10 Claims, 6 Drawing Sheets

(51) Int. Cl.
    *G01R 19/165*     (2006.01)
    *H02M 1/084*     (2006.01)
    *H02P 27/06*     (2006.01)

(52) U.S. Cl.
    CPC .......... *H02M 1/0067* (2021.05); *H02M 1/084* (2013.01); *H02M 3/1586* (2021.05); *H02P 27/06* (2013.01)

(56) References Cited

U.S. PATENT DOCUMENTS

| | | |
|---|---|---|
| 2017/0257038 A1 | 9/2017 | Hasuka et al. |
| 2018/0236893 A1* | 8/2018 | Matsumoto ........... H02M 3/155 |
| 2019/0165689 A1* | 5/2019 | Soto ....................... H02M 7/493 |
| 2019/0366850 A1* | 12/2019 | Ge ......................... B60L 15/007 |

OTHER PUBLICATIONS

Gavagsaz-Ghoachani, R, et al., "Control of a two-phase interleaved boost converter with input LC filter for fuel cell vehicle applications", 2017 IEEE Vehicle Power and Propulsion Conference (VPPC), IEEE, Dec. 11, 2017, 5 pages.

Huangfu, Y, et al., "Flatness-based and Super-Twisting Controllers of Output Series Interleaved Boost Converter for Fuel Cell Applications", 2018 IEEE Industry Applications Society Annual Meetings (IAS), IEEE, Sep. 23, 2018, 7 pages.

RENAUDINEAU, H, et al., "Flatness-based control of a boost inverter for PV microinverter application", 2017 IEEE 8$^{th}$ International Symposium on Power Electronics for Distributed Generation Systems (PEDG), IEEE, April 17, 2017, 6 pages.

* cited by examiner

METHOD FOR CONTROLLING A BOOST CONVERTER HAVING N SWITCHING CELLS

The present invention relates to a method for controlling a boost-type converter with N switching cells.

The invention relates to a DC/DC boost converter, which is a step-up DC voltage converter.

In the field of hybrid or electric motor vehicles, a known solution is to employ boost converters 2 in an electrical assembly 10 comprising an electric drive machine 4, such as shown in FIG. 1.

In such an electrical assembly 10 the boost converter 2 is placed upstream of the voltage inverter 3 and of the electric machine 4, considered as being a dynamic current source.

The boost converter 2 is however positioned downstream of the electrical source 1 and of the input filters.

A boost converter 2 is a converter of the DC-DC type. Its aim is therefore to supply the load it is powering with a DC voltage greater than or equal to that measured at the input.

This type of converter is a non-minimal phase system. Indeed, the transfer function which connects the output voltage to the control, denoted H(s), exhibits a zero in the complex plane having a positive real part.

According to a small-signal model development and linearization about a given stabilized operating point, the transfer function H(s) takes the following form:

$$H(s) = \frac{\tilde{v}_{out}}{\tilde{d}} = \frac{(s-z_1)}{(s-p_1)(s-p_2)}$$

with $z_1>0$, $p_1<0$ and $p_2<0$ which are the zero and the poles of the transfer function H(s), respectively.

Furthermore, a boost converter is a non-minimal phase system which has an output response which is initially the inverse of the variation of the input. The output tends to diverge before converging toward the stabilized point. This is referred to as a destabilization phase of the output voltage. Moreover, the relationships between, on the one hand, its various states and, on the other, the control is non-linear.

Accordingly, a general problem is the stable and fast control of boost converters with N switching cells, where N is a non-zero natural integer.

Notably, the document US2017/0257038A1 is known from the prior art which describes a method for controlling a boost converter with N phases, with N a non-zero natural integer. This method aims to modify the chopping frequency of the system and adds a phase-shift between the control commands of the various cells in order to avoid the resonance frequency of the DC bus. However, such a solution does not allow a control to be obtained which is simultaneously stable, dynamic and fast.

Accordingly, a well-known problem is to obtain a more stable and faster control of such a boost converter instead of using a control with cascading loops which tend to limit the dynamic range of the control with respect to external interference effects.

A method is provided for controlling a boost converter with N switching cells using synchronous pulse-width modulation, in which N is a non-zero natural integer, the converter receiving at the input a DC electrical voltage $V_{in}$ from a voltage source and supplying at the output an output voltage $V_{out}$ greater than or equal to the input voltage $V_{in}$, the method comprising:

a step for measuring the input $V_{in}$ and output $V_{out}$ voltages of said boost converter;

a step for determining an output vector y designed to globally linearize the system of equations of the boost converter;

a step for calculating the variation of power in the electrical load $\dot{P}_{out}$ at the output of the converter;

a step for determining the N duty cycles of the converter as a function of the second derivative ÿ of the output vector y, of the derivative of the power in the electrical load $\dot{P}_{out}$ and of the ratio between the measured input voltage $V_{in}$ and output voltage $V_{out}$; and a step for controlling each switching cell of the converter, as a function of the duty cycle determined.

Thus, a control method may be obtained by non-linear control of a converter with N switching cells via a global linearization and a compensation of non-linearities through a control which guarantees a stable asymptotic convergence of the error. This approach allows the output voltage of the DC-DC converter, which voltage is measured across the terminals of the decoupling capacitor at the input of the voltage inverter, to be regulated at the setpoint voltage set by the user, while at the same time guaranteeing an overall stability of the system and providing a relatively good reactivity and dynamic behavior of the control with respect to external interference effects.

Advantageously and in a non-limiting manner, when the converter comprises N>1 switching cells, the step for determining the N duty cycles comprises the calculation of the energy flow $\Psi_k$ passing through each switching cell. Thus, a calculation may be obtained taking into account the dynamic behavior of the converter.

Advantageously and in a non-limiting manner, the step for determining the N duty cycles comprises;

The calculation of the duty cycle ($\alpha_1$) for the first switching cell (k=1) as a function of the sum of the energy flows ($\Psi_k$) calculated for the switching cells starting from the second by application of the following formula:

$$(1-\alpha_1) = \frac{V_{in}}{V_{out}} - \frac{L_1}{NV_{out}}\left[\frac{\ddot{y}}{V_{in}} + \sum_{k=2}^{N}\Psi_k + \frac{\dot{P}_{out}}{V_{in}}\right]$$

Advantageously and in a non-limiting manner, the step for determining the N duty cycles comprises the calculation of the duty cycle of each switching cell other than the first, as a function of the calculated energy flow, by application of the following system of equations:

$$\begin{cases} (1-\alpha_2) = \dfrac{V_{in}}{V_{out}} - \dfrac{L_2}{NV_{out}}\left[\dfrac{\ddot{y}}{V_{in}} - (N-1)\Psi_2 + \sum_{k=1}^{N-2}\sum_{\substack{m=N-(k-1)\\ m\neq 2}}^{N}\Psi_m + \dfrac{\dot{P}_{out}}{V_{in}}\right] \\[2ex] (1-\alpha_3) = \dfrac{V_{in}}{V_{out}} - \dfrac{L_3}{NV_{out}}\left[\dfrac{\ddot{y}}{V_{in}} - (N-1)\Psi_3 + \sum_{k=1}^{N-2}\sum_{\substack{m=N-(k-1)\\ m\neq 3}}^{N}\Psi_m + \dfrac{\dot{P}_{out}}{V_{in}}\right] \\[2ex] \vdots \\[2ex] (1-\alpha_N) = \dfrac{V_{in}}{V_{out}} - \dfrac{L_3}{NV_{out}}\left[\dfrac{\ddot{y}}{V_{in}} - (N-1)\Psi_{N-1} + \sum_{k=1}^{N-2}\sum_{\substack{m=N-(k-1)\\ m\neq N}}^{N}\Psi_m + \dfrac{\dot{P}_{out}}{V_{in}}\right] \end{cases}$$

Advantageously and in a non-limiting manner, when the converter comprises a single switching cell, the step for determining the duty cycle comprises the application of the following equation:

$$\alpha_1 = 1 - \dfrac{V_{in}}{V_{out}} + \dfrac{L_1}{V_{in}V_{out}}[\ddot{y} + \dot{P}_{out}]$$

Thus, a simpler step for calculating the duty cycle may be obtained when the converter only comprises one switching cell.

Advantageously and in a non-limiting manner, the step for controlling each switching cell comprises the generation of a control signal for each switching cell, which is a function of a logical comparison between the determined duty cycles and a high-frequency symmetrical triangular carrier signal, imposing a chopping frequency on the converter. Advantageously and in a non-limiting manner, the comparison comprises:

for the first switching cell (k=1):
  if $\alpha_1 \geq carrier_1$, $PWM_1=1$;
  if not, $PWM_1=0$;
for the other switching cells (k>1):
  if $\alpha_k \geq carrier_k$, $PWM_k=1$;
  if not, $PWM_k=0$;
with $carrier_k$ phase-shifted from $carrier_1$ by $2q\pi/N$ where q is a natural integer multiple of two.

Thus, the control step is based on simple logical comparisons ensuring a fast execution of this step.

Advantageously and in a non-limiting manner, for each switching cell, the boost converter comprises an inductance and the output vector is furthermore calculated as a function of the measured currents for each inductance. Thus, the output vector may be calculated in a reliable manner.

Advantageously and in a non-limiting manner, the average values of the currents measured for each inductance are obtained by sampling, at the minimum or maximum value, each of the N carriers used for the generation of the chopping of the power switches.

The invention also relates to an electrical assembly comprising a DC electrical source, a boost converter with N switching cells, a DC-AC voltage converter, an electric machine, and a device for controlling said boost converter designed to implement a method such as previously described.

Other features and advantages of the invention will become apparent upon reading the description presented hereinafter of one particular embodiment of the invention, given by way of non-limiting example, with reference to the appended drawings in which FIG. 1 is a schematic circuit diagram of an electrical power supply according to the invention;

Figure 1:
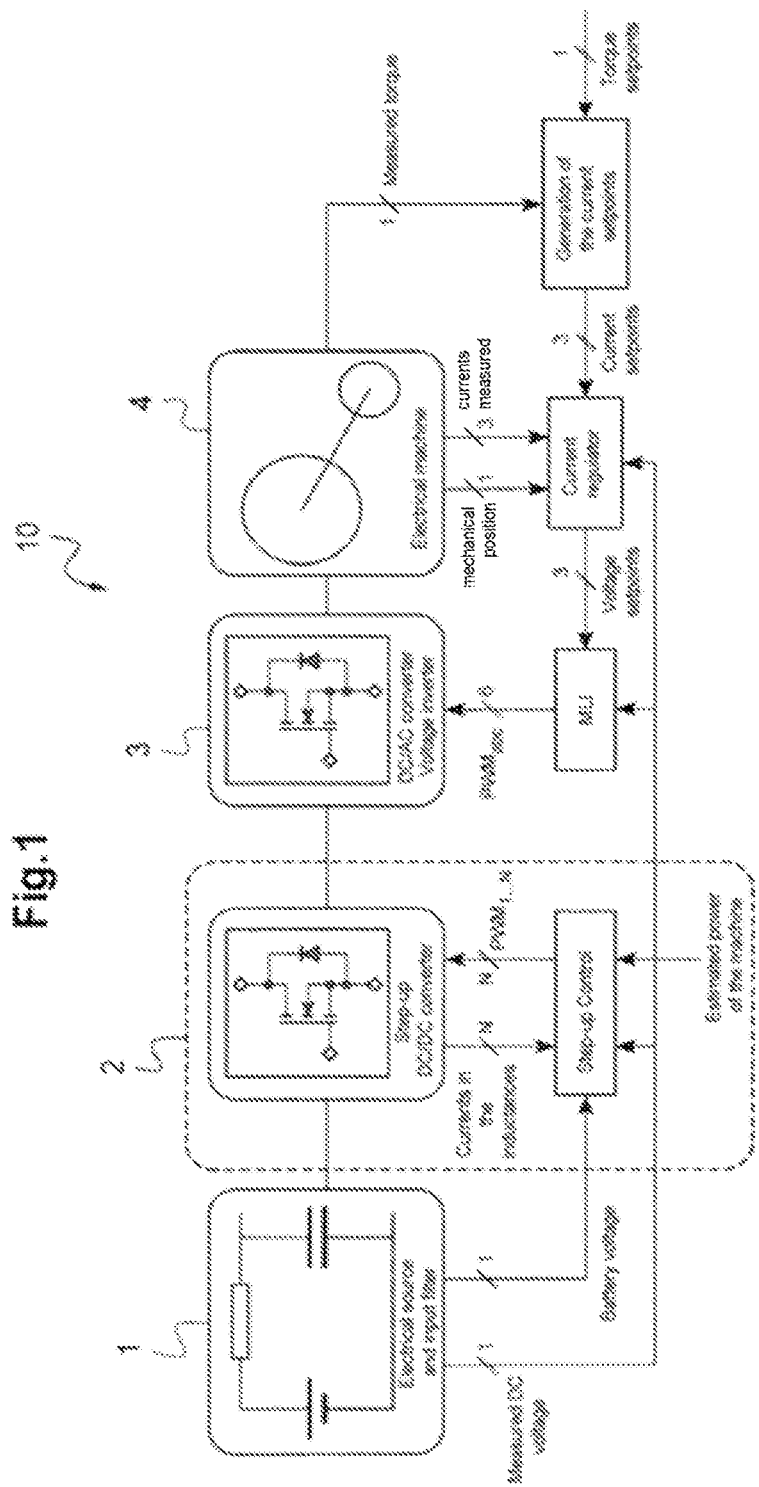
Figure 2:
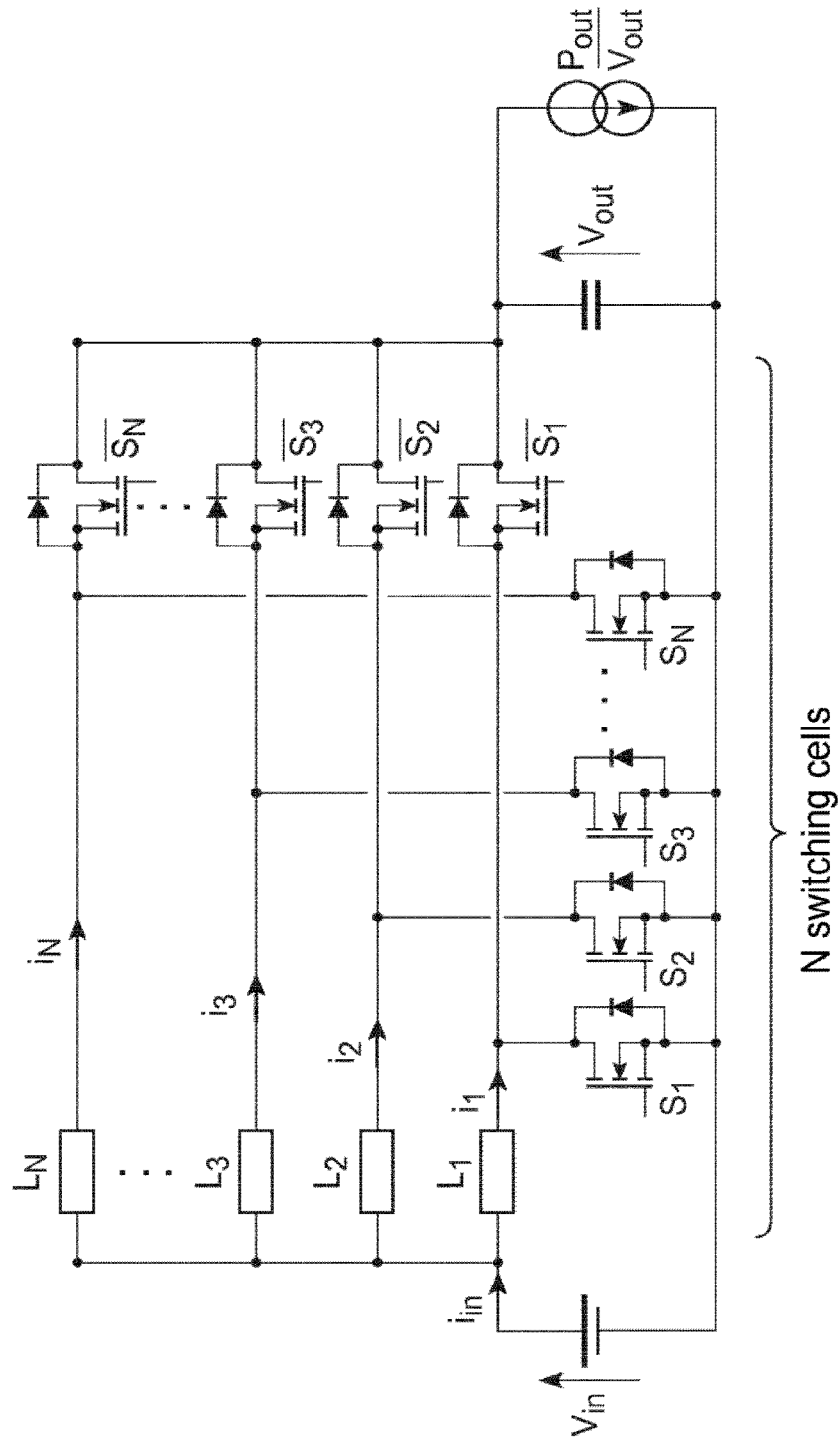
FIG. 2 is a schematic view of a boost converter with N phases, N being a non-zero natural integer, here greater than 3, controlled according to the first embodiment of the invention.

In a first embodiment of the invention, with reference to FIGS. 1 to 5, a non-linear control method by exact linearization with state feedback of a voltage step-up converter with "N" switching cells is described.

This method allows the non-linearities exhibited by the system that it is desired to control to be compensated.

The form of this compensation is associated with the structure of the system. By way of example, in order to compensate a non-linear term, denoted $\vartheta(x)$, by a subtraction, the control vector u at the input of the system and the non-linear term $\vartheta(x)$ must appear together in the form of an addition $u+\vartheta(x)$.

On the other hand, in order to compensate $\vartheta(x)$, by a division, the control vector u and the non-linear term must appear together in the form of a multiplication $u \cdot \vartheta(x)$.

The equations of the boost converter with N switching cells are as follows:

$$\begin{cases} C_{out}\dfrac{dV_{out}}{dt} = (1-\alpha_1)i_1 + (1-\alpha_2)i_2 + \ldots + (1-\alpha_N)i_N - \dfrac{P_{out}}{V_{out}} & (1)\\[1.5ex] L_1\dfrac{di_1}{dt} = V_{in} - (1-\alpha_1)V_{out} \\[1.5ex] L_2\dfrac{di_2}{dt} = V_{in} - (1-\alpha_2)V_{out} \\[1.5ex] \vdots \\[1.5ex] L_N\dfrac{di_N}{dt} = V_{in} - (1-\alpha_N)V_{out} \end{cases}$$

The equation (1) may be written in the generic form of the following affine non-linear equation:

$$\frac{dX}{dt} = f(X, t) + g(X, t) \cdot u(t) \qquad (2)$$

Thus, the equation (2) becomes:

$$\begin{pmatrix} \frac{di_1}{dt} \\ \frac{di_2}{dt} \\ \vdots \\ \frac{di_N}{dt} \\ \frac{dV_{out}}{dt} \end{pmatrix} = \begin{pmatrix} \frac{V_{in}V_{out}}{L_1} \\ \frac{V_{in}V_{out}}{L_2} \\ \vdots \\ \frac{V_{in}V_{out}}{L_N} \\ \frac{1}{C_{out}}\left(\sum_{k=1}^{N} i_k - \frac{P_{out}}{V_{out}}\right) \end{pmatrix} + \begin{pmatrix} \frac{V_{out}}{L_1} & 0 & \cdots & 0 \\ 0 & \frac{V_{out}}{L_2} & \cdots & 0 \\ 0 & 0 & \ddots & 0 \\ 0 & 0 & \cdots & \frac{V_{out}}{L_N} \\ -\frac{i_1}{C_{out}} & -\frac{i_2}{C_{out}} & \cdots & -\frac{i_N}{C_{out}} \end{pmatrix} \begin{pmatrix} \alpha_1 \\ \alpha_2 \\ \vdots \\ \alpha_N \end{pmatrix} \qquad (3)$$

with $X \in \mathbb{R}^n = (i_1, i_2 \ldots i_N V_{out})^t$ the vector of the state variables of the system, $u(t) = (\alpha_1 \ldots \alpha_N) \in \mathbb{R}^m$ represents the control vector considered as an input to the system, $\alpha_k$ being the duty cycle applied to the switch $S_k$ of the k-th switching cell, and $1-\alpha_k$ the duty cycle applied to the switch $\overline{S_k}$ of the k-th switching cell.

$f(X)$ and $g(X)$ are indefinitely differentiable non-linear functions;

$(L_1, L_2, \ldots, L_N)$ and $C_{out}$ are the inductances of each switching cell and the capacitor at the output of the boost converter, respectively;

$i_1, i_2, \ldots, i_N$ and $V_{out}$ are the currents in each inductance and the voltage at the output of the boost converter, respectively;

$P_{out}$ is the power of the dynamic load connected to the boost converter at the output.

The aim of the method according to the invention is to control the flow of the energy, from the voltage source at the input to the load at the output, while at the same time regulating the voltage at the output $V_{out}$ of the boost converter at a setpoint value denoted $V_{out}^{ref}$.

The first step of the method consists in choosing the output vector, denoted y, so as to allow a global linearization of the system.

The following equation (4) allows an output vector of the globally linearized system to be obtained with internal dynamics that are zero, for the case of a converter with N arms:

$$y = h(X, t) = \frac{1}{2}\sum_{k=1}^{N} L_k i_k^2 + \frac{1}{2}C_{out}V_{out}^2 \qquad (4)$$

A second step of the method comprises a series of successive derivations of the output vector y until the appearance of the control vector $u(t) = \alpha_{k=1,\ldots,N}$:

First of all, a derivative of first order for the equation (4) yields the following equation:

$$\dot{y} = \left[V_{in}\sum_{k=1}^{N} i_k\right] - P_{out} \qquad (5)$$

This equation represents the losses generated by the boost converter or its energy balance.

Subsequently, a derivative of second order for the equation (4) yields the following equation:

$$\ddot{y} = V_{in}^2\left(\sum_{k=1}^{N}\frac{1}{L_k}\right) - V_{in}V_{out}\left(\sum_{k=1}^{N}\frac{1-\alpha_k}{L_k}\right) - \frac{dP_{out}}{dt} \qquad (6)$$

Subsequently, a step for calculating the energy flow $\Psi_k$ passing through each switching cell k is implemented, which allows, with the equation (6), a system of N equations with N unknowns to be obtained via which the control $\alpha_k$ required for each cell k of the boost converter with N cells can be determined.

$$\begin{cases} \Psi_2 = \left(\frac{1}{L_1} - \frac{1}{L_2}\right)V_{in} - \left[\frac{(1-\alpha_1)}{L_1} - \frac{(1-\alpha_2)}{L_2}\right]V_{out} \\ \Psi_3 = \left(\frac{1}{L_1} - \frac{1}{L_3}\right)V_{in} - \left[\frac{(1-\alpha_1)}{L_1} - \frac{(1-\alpha_3)}{L_3}\right]V_{out} \\ \vdots \\ \Psi_N = \left(\frac{1}{L_1} - \frac{1}{L_N}\right)V_{in} - \left[\frac{(1-\alpha_1)}{L_1} - \frac{(1-\alpha_N)}{L_N}\right]V_{out} \end{cases} \qquad (7)$$

where $\Psi_k = \frac{d(i_1 - i_k)}{dt}$ with k>1.

Starting from the preceding equation (7), the following are determined:

the equation for the control of the first cell of the boost converter with N arms in the following manner:

$$(1-\alpha_1) = \frac{V_{in}}{V_{out}} - \frac{L_1}{NV_{out}}\left[\frac{\ddot{y}}{V_{in}} + \sum_{k=2}^{N}\Psi_k + \frac{\dot{P}_{out}}{V_{in}}\right] \qquad (8)$$

the equations for the control of the N−1 cells of the boost converter:

$$\begin{cases} (1-\alpha_2) = \frac{V_{in}}{V_{out}} - \frac{L_2}{NV_{out}} \left[ \frac{\ddot{y}}{V_{in}} - (N-1)\Psi_2 + \sum_{k=1}^{N-2} \sum_{\substack{m=N-(k-1) \\ m \neq 2}}^{N} \Psi_m + \frac{\dot{P}_{out}}{V_{in}} \right] \\ (1-\alpha_3) = \frac{V_{in}}{V_{out}} - \frac{L_3}{NV_{out}} \left[ \frac{\ddot{y}}{V_{in}} - (N-1)\Psi_3 + \sum_{k=1}^{N-2} \sum_{\substack{m=N-(k-1) \\ m \neq 3}}^{N} \Psi_m + \frac{\dot{P}_{out}}{V_{in}} \right] \\ \vdots \\ (1-\alpha_N) = \frac{V_{in}}{V_{out}} - \frac{L_3}{NV_{out}} \left[ \frac{\ddot{y}}{V_{in}} - (N-1)\Psi_{N-1} + \sum_{k=1}^{N-2} \sum_{\substack{m=N-(k-1) \\ m \neq N}}^{N} \Psi_m + \frac{\dot{P}_{out}}{V_{in}} \right] \end{cases} \quad (9)$$

In order to obtain a stable asymptotic tracking of the error, on pose:

$$\ddot{y} = k'_1(\dot{y}^{ref} - \dot{y}) + k'_2(y^{ref} - y) + k'_3 \int_\tau (y^{ref} - y) d\tau \quad (10)$$

where $\{k'_1, k'_2, k'_3\}$ are calibratable gains of the regulator of the equation (10), and $$\dot{\Psi}_k = k_1(\Psi_k^{ref} - \Psi_k) + k_2 \int_\tau (\Psi_k^{ref} - \Psi_k) d\tau \quad (11)$$

where $\{k'_1, k'_2\}$ are calibratable gains of the regulator of the equation (11) and
$\Psi_k = i_1 - i_k$, and $\Psi_k^{ref}$ the flow setpoint of the k-th cell.

More generally, the variables indexed "ref" relate to setpoint values of the corresponding variable.

Thus, the calculation of $\ddot{y}$ in the equation (6) which represents a control by state feedback comprises, with reference to the equation (10):

a proportional action which acts on the error $V_{in}\Sigma_{k=1}^{N}[i_k^{ref} - i_k]$;

a proportional action which acts on the error between y and $y^{ref}$;

an integral action which acts on the error between y and $y^{ref}$;

The calculation of $y^{ref}$, the setpoint output vector, and of its derivative $\dot{y}^{ref}$ are obtained by the following equation:

$$y^{ref} = \frac{1}{2} \sum_{k=1}^{N} L_k (i_k^{ref})^2 + \frac{1}{2} C_{out} (V_{out}^{ref})^2 \quad (12)$$

and where:

$$\begin{cases} i_k^{ref} = \frac{P_{out}}{N \times \eta \times V_{in}} \\ V_{out}^{ref} \geq V_{in} \end{cases} \quad (13)$$

with $\eta$ representing the efficiency of the system which depends on the operating point and N represents the number of the cell, and:

$$\dot{y}^{ref} = \left[ V_{in} \sum_{k=1}^{N} i_k^{ref} \right] - P_{out} \quad (14)$$

Re-using the equations (8) and (9), it is noted that, in a stabilized regime, the N duty cycles $\alpha_{k=1,\ldots,N}$ converge toward the following final value:

$$\alpha_{k=1,\ldots,N} = 1 - \frac{V_{in}}{V_{out}} \quad (15)$$

This expression corresponds to the open-loop transfer function (in other words, the static gain) of the boost converter.

Figure 3:
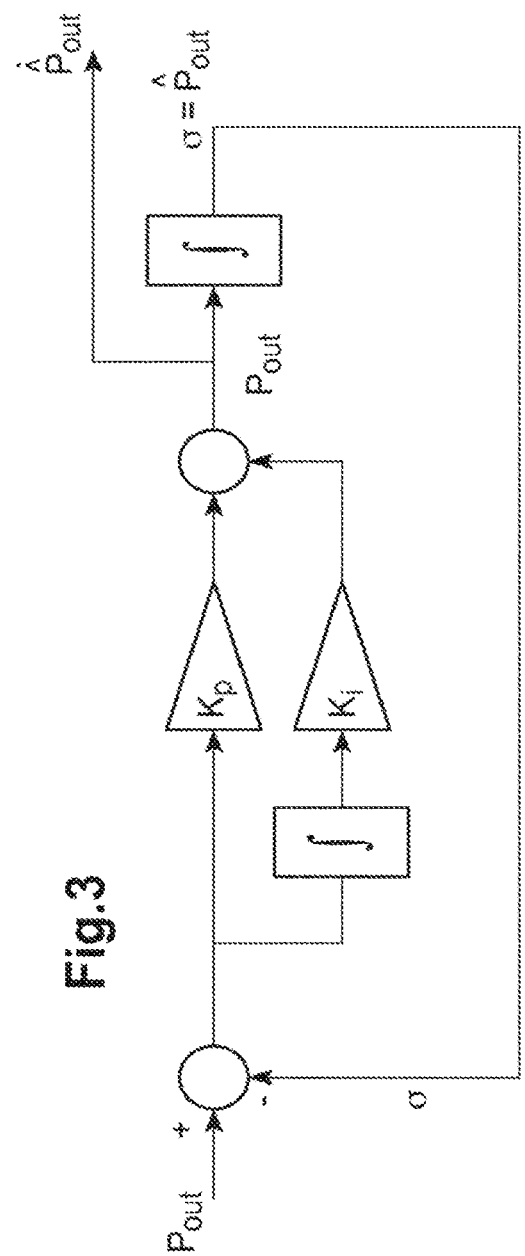
FIG. 3 is a schematic diagram of the step for calculating the variation of the power at the output of the boost converter, according to the invention.

In order to calculate the derivative of the output power $\dot{P}_{out}$, with reference to FIG. 3, the following change of variable is made:

$$\begin{cases} \sigma = \hat{P}_{out} \\ \dot{\sigma} = \dot{\hat{P}}_{out} \end{cases} \quad (16)$$

where $\hat{P}_{out}$ is the estimated output power shown in FIG. 3. In the stabilized regime, it is desired to obtain:

$$\begin{cases} \sigma \neq 0 \\ \dot{\sigma} = 0 \end{cases} \quad (17)$$

Also, with reference to FIG. 3, the variation of the output power is estimated by the following equation:

$$\dot{\sigma} = k_p(P_{out} - \sigma) + k_i \int_\tau (P_{out} - \sigma) d\tau \quad (18)$$

with $\{k_p, k_i\}$ being calibratable gains.

Thus, the variation of the power in the load $\dot{P}_{out}$ is obtained through an observer of reduced order.

Figure 4:
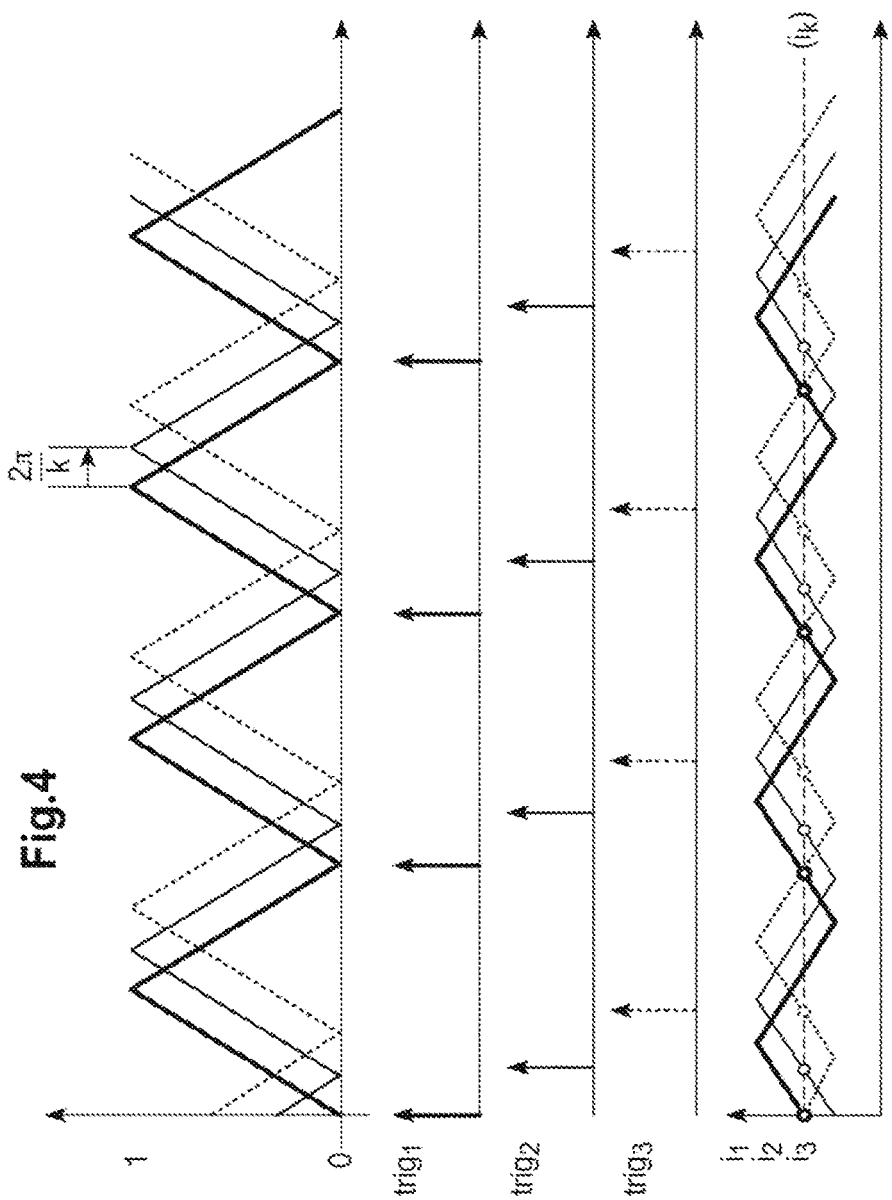
FIG. 4 is a graphical representation of the step for sampling the currents, for the first embodiment of the invention, in one example with three interlaced switching cells.
Figure 5:
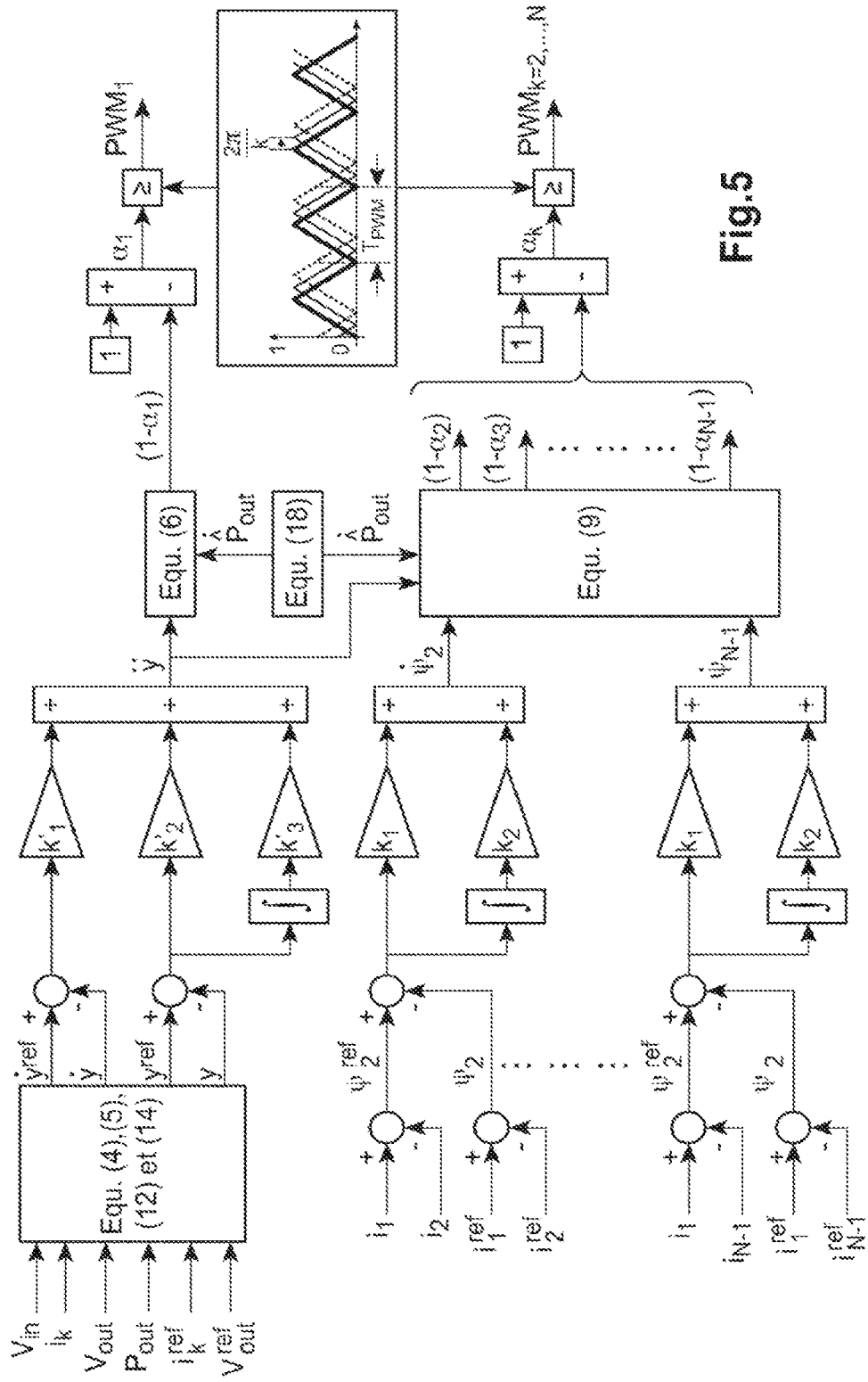
FIG. 5 is a schematic view of the non-linear control method according to the first embodiment of the invention.

Subsequently, the method implements a step for sampling the currents in order to obtain their average value and the generation of the chopping, with reference to FIG. 4.

The high-frequency signals dedicated to the chopping of each switching cell, and denoted $PWM_{k=1,\ldots,N}$, are generated through a logical comparison between the control signals denoted $\alpha_{k=1,\ldots,N}$ and a high-frequency symmetrical triangular signal (called the carrier) which imposes the chopping frequency of the power converter. In addition, there exists one carrier per switching cell.

Each carrier is phase-shifted from the other by $2q\pi/N$ with q being a natural integer multiple of two and N is the number of switching cells.

However, for the switching cell number 1, the following logic is followed:

if $\alpha_1 \geq carrier_1$, $PWM_1 = 1$;
if not, $PWM_1 = 0$.
for the switching cell number 2, the following logic is followed:
if $\alpha_2 \geq carrier_2$, $PWM_2 = 1$;
if not, $PWM_2 = 0$,
where $carrier_2$ is phase-shifted from $carrier_1$ by $2\pi/N$.
For the switching cell number 3, the following logic is followed:
if $\alpha_3 \geq carrier_3$, $PWM_3 = 1$;
if not, $PWM_3 = 0$,
where $carrier_3$ is phase-shifted from $carrier_1$ by $4\pi/N$.
For the switching cell number k, the following logic is followed:
if $\alpha_k \geq carrier_k$, $PWM_k = 1$;
if not, $PWM_k = 0$,
where $carrier_k$ is phase-shifted from $carrier_1$ by $2q\pi/N$.

Thus, the average value of each current, denoted $\langle i_k \rangle$, may be captured through a sampling which is at the minimum (or maximum) value of each carrier. The sampling signal (denoted $trig_k$) is in phase with the carrier which corresponds to it.

This approach, only applicable in the framework where a hardware target of the FPGA type is used, allows the approach using filtering of the currents to be avoided which approach would lead to a delay in the control that would need to be compensated.

The sampling signal for the current measured in the inductance takes place at the minimum or maximum value of the carrier in order to obtain the mean component of the current without adding any delay which comes from the filtering of the real signal in the case where a low-pass digital filter is used.

Figure 6:
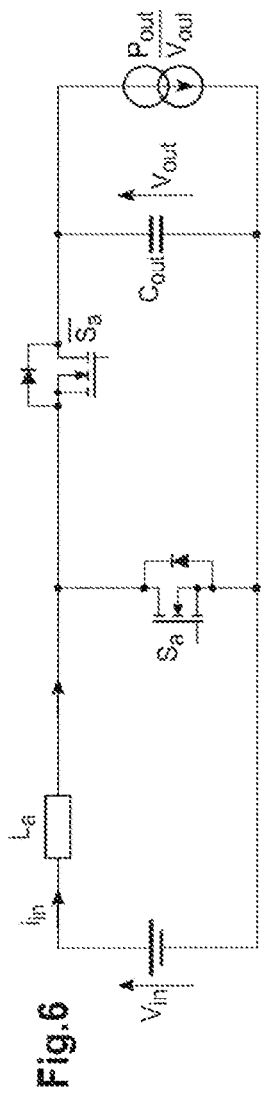
FIG. 6 is a schematic view of a single-stage boost converter, controlled by the second embodiment of the invention.
Figure 7:
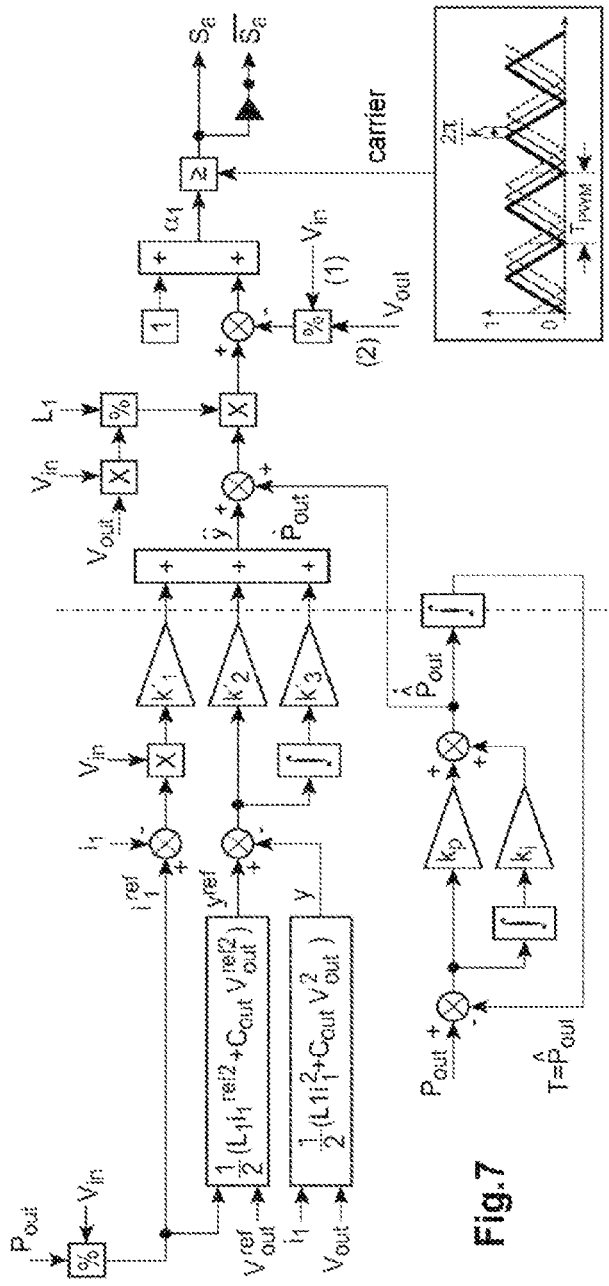
FIG. 7 is a schematic view of the non-linear control method according to the second embodiment of the invention.

In a second embodiment of the invention, for a boost converter with a single switching cell, also referred to as single-stage boost converter, with reference to FIG. 1 and to FIGS. 6 and 7, the method comprises the same main implementation steps but their modes of calculation may be simplified.

The equations for the single-stage boost converter are the following:

$$\begin{cases} C_{out} \dfrac{dV_{out}}{dt} = (1 - \alpha_1) \cdot i_1 - \dfrac{P_{out}}{V_{out}} \\ L_1 \dfrac{di_1}{dt} = V_{in} - (1 - \alpha_1) \cdot V_{out} \end{cases} \quad (19)$$

The equation (19) may be written in the generic form of the following affine non-linear equation:

$$\dfrac{dX}{dt} = f(X, t) + g(X, t) \cdot u(t) \quad (20)$$

Thus, the equation (20) becomes:

$$\begin{pmatrix} \dfrac{di_1}{dt} \\ \dfrac{dV_{out}}{dt} \end{pmatrix} = \begin{pmatrix} \dfrac{V_{in} - V_{out}}{L_1} \\ \dfrac{1}{C_{out}} \cdot \left( i_1 - \dfrac{P_{out}}{V_{out}} \right) \end{pmatrix} + \begin{pmatrix} \dfrac{V_{out}}{L_1} \\ \dfrac{-i_1}{C_{out}} \end{pmatrix} \alpha_1 \quad (21)$$

with
$X \in \mathbb{R}^2 = (i_1 \ V_{out})^t$ the vector of the state variables of the system,
$u(t) = \alpha_1 \in \mathbb{R}^{\wedge}1$ represents the control vector considered as an input to the system, $\alpha_1$ being the duty cycle applied to the switch $S_a$ of the switching cell, and $1 - \alpha_1$ the duty cycle applied to the switch $\overline{S_a}$ of the switching cell.
$f(X)$ and $g(X)$ are indefinitely differentiable non-linear functions;
$L_1$ and $C_{out}$ are the inductance and the capacitance of the boost, respectively;
$i_1$ and $V_{out}$ are the current in the inductance and the voltage at the output of the boost, respectively;
$P_{out}$ is the power in the dynamic load connected to the boost converter at the output.

The aim of the method according to this embodiment is then to control, via a single regulation loop, the flow of energy from the voltage source at the input toward the load at the output, while at the same time regulating the voltage at the output $V_{out}$ of the boost converter at a setpoint value denoted $V_{out}^{ref}$.

The first step of the method consists in choosing the output vector so as to allow a global linearization of the system.

The following equation (22), which represents the output vector that allows the system of equations (21) to be globally linearized, allows an output vector to be obtained for the globally linearized system, for the case of a single-stage boost converter:

$$y = h(X, t) = \tfrac{1}{2} L_1 i_1^2 + \tfrac{1}{2} C_{out} V_{out}^2 \quad (22)$$

A second step of the method comprises a change of reference, through a series of successive derivatives until the appearance of the control vector $u(t) = \alpha_{k=1, \ldots, N}$:
First of all, a derivative of first order for the equation (22) yields the following equation:

$$\dot{y} = V_{in} i_1 - P_{out} \quad (23)$$

This equation represents the losses generated by the boost converter.

Subsequently, a derivative of second order for the equation (22) yields the following equation:

$$\ddot{y} = \dfrac{V_{in}^2}{L_1} - V_{in} V_{out} \left( \dfrac{1 - \alpha_1}{L_1} \right) - \dfrac{dP_{out}}{dt} \quad (24)$$

Starting from the above, the equation of the duty cycle $\alpha_1$ is deduced such that:

$$\alpha_1 = 1 - \dfrac{V_{in}}{V_{out}} + \dfrac{L_1}{V_{in} V_{out}} \left[ \ddot{y} + \dot{P}_{out} \right] \text{ with} \quad (25)$$

$$\dot{P}_{out} = \dfrac{dP_{out}}{dt}.$$

However, in the stabilized regime (at constant power), the duty cycle $\alpha_1$ converges toward the following final value:

$$\alpha_1 = 1 - \dfrac{V_{in}}{V_{out}} \quad (26)$$

Thus, the duty cycle calculated dynamically in (25), converges asymptotically and stably toward the equation (26) in the stabilized regime.

This expression corresponds to the open-loop transfer function (in other words, the static gain) of the boost converter 2.

In order to obtain an asymptotic exponential tracking, the following is posed:

for the calculation of the second derivative of the control vector $\ddot{y}$:

$$(\ddot{y}-\ddot{y}^{ref})+k'_1(\dot{y}-\dot{y}^{ref})+k'_2(y-y^{ref})+k'_3\int_\tau(y-y^{ref})d\tau=0 \quad (27)$$

with $\ddot{y}^{ref}=\dot{y}^{ref}=0$ and $\dot{y}$ obtained by the equation (23) previously presented. Thus, the generic form of the first regulator is determined such that:

$$\ddot{y}=k'_1(\dot{y}^{ref}-\dot{y})+k'_2(y^{ref}-y)+k'_3\int_\tau(y^{ref}-y)d\tau \quad (28)$$

where $\{k'_1,k'_2,k'_3\}$ are calibratable gains of the regulator.

The calculation of $\ddot{y}$, which corresponds to a control by state feedback, with reference to the equation (28) therefore comprises:

a proportional action which acts on the error $V_{in}(i_1^{ref}-i_1)$;

a proportional action which acts on the error between y and $y^{ref}$;

an integral action which acts on r the error between y and $y^{ref}$.

Furthermore, the calculation of $y^{ref}$ and of $\dot{y}^{ref}$ is carried out in the following manner:

$$y^{ref} = \frac{1}{2}L_1\left(i_1^{ref}\right)^2 + \frac{1}{2}C_{out}\left(V_{out}^{ref}\right)^2 \text{ with} \quad (29)$$

$$\begin{cases} i_1^{ref} = \frac{P_{out}}{\eta \times V_{in}} \\ V_{out}^{ref} \geq V_{in} \end{cases} \quad (30)$$

where η represents the efficiency of the system which depends on the operating point.

In addition, $$\dot{y}^{ref}=V_{in}i_1^{ref}-P_{out} \quad (31)$$

and, for the estimation of the variation of the derivative of the power at the output $\dot{P}_{out}$:

the following change of variable is carried out:

$$\begin{cases} \sigma = \dot{P}_{out} \\ \dot{\sigma} = \ddot{P}_{out} \end{cases} \quad (32)$$

and, it is desired to obtain in the stabilized regime:

$$\begin{cases} \sigma \neq 0 \\ \dot{\sigma} = 0 \end{cases} \quad (33)$$

Starting from here, the variation of the output power is estimated in the following manner:

$$\dot{\sigma}=k_p(P_{out}-\sigma)+k_i\int_\tau(P_{out}-\sigma)d\tau \quad (34)$$

where $k_p$ and $k_i$ are calibratable gains.

The invention claimed is:

1. A method for controlling a boost converter with N switching cells in synchronous pulse-width modulation mode, in which N is a non-zero natural integer, the converter receiving at an input a DC electrical voltage ($V_{in}$) from a voltage source and supplying at the output an output voltage ($V_{out}$) greater than or equal to the input voltage ($V_{in}$), the method comprising:

measuring the input ($V_{in}$) and output ($V_{out}$) voltages of said boost converter;

determining an output vector (y) configured to globally linearize a system of equations of the boost converter;

calculating a power variation in an electrical load at the output of the converter ($\dot{P}_{out}$);

determining the N duty cycles ($\alpha_k$) of the converter as a function of the second derivative ($\ddot{y}$) of the output vector (y), of the derivative of the power in the electrical load ($\dot{P}_{out}$), and of a ratio between the measured input voltage ($V_{in}$) and output voltage ($V_{out}$); and controlling each switching cell (k) of the converter, as a function of the duty cycle determined ($\alpha_k$).

2. The method as claimed in claim 1, wherein, when the converter comprises N>1 switching cells (k), the determining the N duty cycles comprises calculating an energy flow ($\dot{\Psi}_k$) passing through each switching cell (k).

3. The method as claimed in claim 2, wherein the determining the N duty cycles comprises:

calculating the duty cycle ($\alpha_1$) for the first switching cell (k=1) as a function of the sum of the calculated energy flows ($\dot{\Psi}_k$) for the switching cells starting from the second by applying the following formula:

$$(1-\alpha_1) = \frac{V_{in}}{V_{out}} - \frac{L_1}{NV_{out}}\left[\frac{\ddot{y}}{V_{in}} + \sum_{k=2}^{N}\dot{\Psi}_k + \frac{\dot{P}_{out}}{V_{in}}\right].$$

4. The method as claimed in claim 3, wherein the determining the N duty cycles comprises calculating the duty cycle of each switching cell other than the first (k>1), as a function of the energy flow ($\dot{\Psi}_k$) by applying the following system of equations:

$$\begin{cases} (1-\alpha_2) = \frac{V_{in}}{V_{out}} - \frac{L_2}{NV_{out}}\left[\frac{\ddot{y}}{V_{in}} - (N-1)\dot{\Psi}_2 + \sum_{k=1}^{N-2}\sum_{\substack{m=N-(k-1)\\m\neq 2}}^{N}\dot{\Psi}_m + \frac{\dot{P}_{out}}{V_{in}}\right] \\ (1-\alpha_3) = \frac{V_{in}}{V_{out}} - \frac{L_3}{NV_{out}}\left[\frac{\ddot{y}}{V_{in}} - (N-1)\dot{\Psi}_3 + \sum_{k=1}^{N-2}\sum_{\substack{m=N-(k-1)\\m\neq 3}}^{N}\dot{\Psi}_m + \frac{\dot{P}_{out}}{V_{in}}\right] \\ \vdots \\ (1-\alpha_N) = \frac{V_{in}}{V_{out}} - \frac{L_3}{NV_{out}}\left[\frac{\ddot{y}}{V_{in}} - (N-1)\dot{\Psi}_{N-1} + \sum_{k=1}^{N-2}\sum_{\substack{m=N-(k-1)\\m\neq N}}^{N}\dot{\Psi}_m + \frac{\dot{P}_{out}}{V_{in}}\right] \end{cases}.$$

5. The method as claimed in claim 1, when the converter comprises a single switching cell, wherein the determining the duty cycle comprises applying the following equation:

$$\alpha_1 = 1 - \frac{V_{in}}{V_{out}} + \frac{L_1}{V_{in}V_{out}}[\ddot{y} + \dot{P}_{out}].$$

6. The method as claimed in claim 1, wherein the controlling each switching cell comprises generating a control signal ($PWM_k$) for each switching cell, which is a function of a logical comparison between the duty cycles determined ($\alpha_{k-1, \ldots, N}$) and a high-frequency symmetrical triangular carrier signal (carrier$_k$) imposing a chopping frequency on the converter.

7. The method as claimed in claim 6, wherein the comparison comprises:
for the first switching cell (k=1):
if $\alpha_1 \geq$ carrier$_1$, PWM$_1$=1;
if not, PWM$_1$=0;
for the other switching cells (k>1):
if $\alpha_k \geq$ carrier$_k$, PWM$_k$=1;
if not, PWM$_k$=0;
with carrier$_k$ phase-shifted from carrier$_1$ by $2q\pi/N$ where q is a natural integer multiple of two.

8. The method as claimed in claim 7, wherein the boost converter comprises, for each switching cell, an inductance ($L_k$), the output vector (y) is calculated as a function of the measured currents ($i_k$) for each inductance ($L_k$), and average values of the measured currents ($i_k$) for each inductance ($L_k$) are obtained by sampling at the minimum or maximum value each of the N carriers used for the generation of the chopping of the power switches.

9. The method as claimed in claim 1, wherein the boost converter comprises, for each switching cell, an inductance ($L_k$), and the output vector (y) is calculated as a function of the measured currents ($i_k$) for each inductance ($L_k$).

10. An electrical assembly, comprising:
a DC electrical source;
a boost converter with N switching cells;
a DC-AC voltage converter; an electrical machine; and
a device configured to control said boost converter to implement the method as claimed in claim 1.

* * * * *